United States Patent
Shih et al.

(10) Patent No.: US 6,391,780 B1
(45) Date of Patent: May 21, 2002

(54) METHOD TO PREVENT COPPER CMP DISHING

(75) Inventors: Tsu Shih, Hsin-Chu; Ying-Ho Chen, Taipei; Jih-Churng Twu, Chung Ho, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/378,949

(22) Filed: Aug. 23, 1999

(51) Int. Cl.[7] ............................................. H01L 21/302
(52) U.S. Cl. ....................... 438/692; 438/751; 438/754; 438/756; 438/697; 438/687; 216/88; 216/105
(58) Field of Search ................................. 438/692, 693, 438/697, 700, 751, 754, 756, 637, 687, 643, 644; 216/88, 105

(56) References Cited

U.S. PATENT DOCUMENTS

| 4,789,648 A |   | 12/1988 | Chow et al. ................. 437/225 |
| 5,451,551 A |   | 9/1995 | Krishnan et al. ............ 437/241 |
| 5,731,245 A |   | 3/1998 | Joshi et al. .................. 438/705 |
| 5,814,557 A | * | 9/1998 | Venkatraman et al. ....... 438/622 |
| 5,824,599 A |   | 10/1998 | Schacham-Diamond et al. ............................ 438/678 |
| 6,004,188 A | * | 12/1999 | Roy ............................. 451/41 |
| 6,017,803 A | * | 1/2000 | Wong .......................... 438/430 |
| 6,051,496 A | * | 4/2000 | Jang ............................ 438/687 |

* cited by examiner

Primary Examiner—Gregory Mills
Assistant Examiner—George Goudreau
(74) Attorney, Agent, or Firm—George O. Saile; Stephen B. Ackerman

(57) ABSTRACT

A process for manufacturing damascene wiring in integrated circuits is described. Trenches in the top most layer are first over-filled with a soft metal (such as copper) and then a relatively thin layer of a hard material such as tantalum, tantalum nitride, titanium, titanium nitride etc is deposited on the copper surface Under a first set of control conditions CMP is then applied for just long enough to selectively remove this hard material layer from peaks in the copper surface while leaving it intact in the valleys. The control conditions for CMP are then adjusted so that CMP can proceed with material at the peaks being removed at a significantly faster rate than in the valleys. Thus, when the point is reached that all copper outside the trenches has been removed, the trenches are found to be just filled with a flat layer that has no dishing.

20 Claims, 2 Drawing Sheets

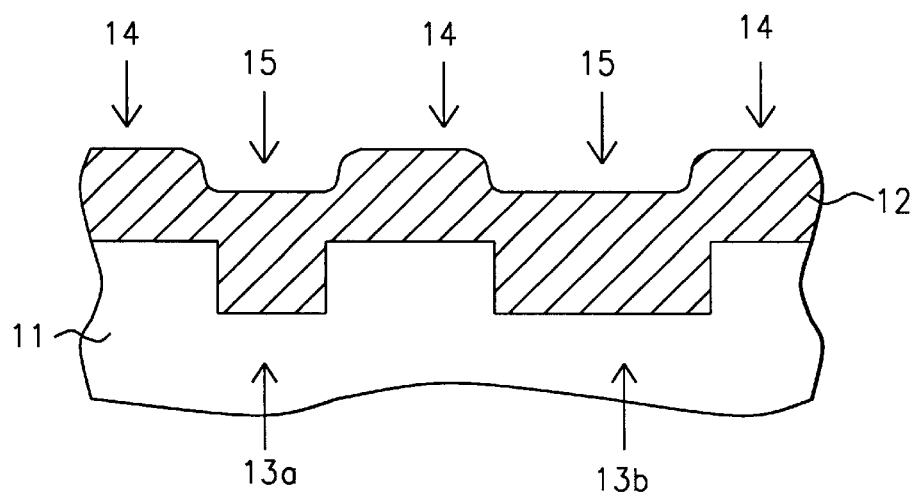
FIG. 1 – Prior Art
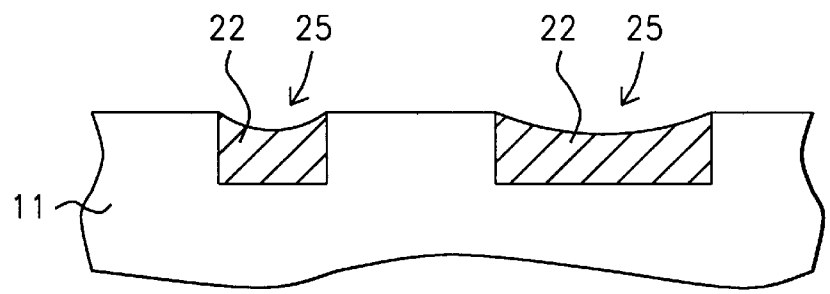
FIG. 2 – Prior Art
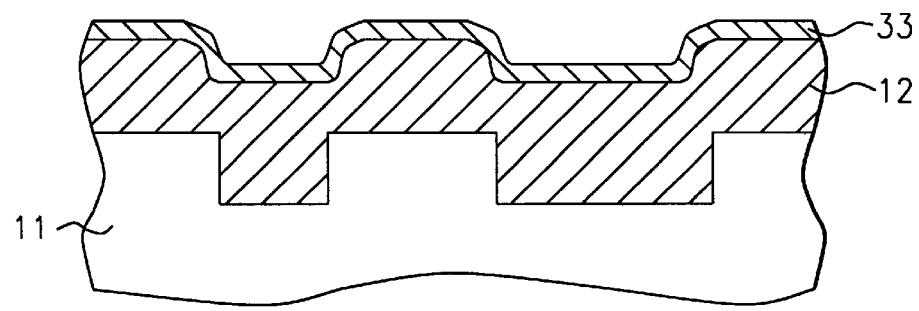
FIG. 3

METHOD TO PREVENT COPPER CMP DISHING

FIELD OF THE INVENTION

The invention relates to the general field of integrated circuit manufacture with particular reference to formation of copper based damascene wiring.

BACKGROUND OF THE INVENTION

A number of problems faced the semiconductor industry as wiring grew ever smaller and more complex. As the number of layers associated with the completed structure grew so did the problem of planarization become more acute. Additionally, as inter-metal dielectric layers grew thinner, possible leakage problems due to incomplete coverage of wiring by the deposited dielectric material became more likely. Still another problem was that metals having better conductivity than aluminum (such as copper or silver) were needed to improve the conductance of the thinner wires. These metals are known to be rapid diffusers that 'poison' silicon so they needed to be confined by diffusion barriers. Similar problems to the already mentioned dielectric coverage problems then arose in connection with such barrier layers.

A solution to many of the above problems has been to use damascene wiring. The term 'damascene' is derived from a form of inlaid metal jewelry first seen in the city of Damascus. In the context of integrated circuits it implies a patterned layer imbedded on and in another layer such that the top surfaces of the two layers are coplanar. Thus, instead of forming wiring on a planar dielectric surface, trenches are first etched in the dielectric and then filled with the conducting metal.

In practice, filling of the trenches in damascene wiring is accomplished by first overfilling and then planarizing the resulting surface until all metal outside the trench has been removed. Ideally, the metal and dielectric surfaces will be exactly coplanar in the final product. Conventional etching is unsuitable for planarizing as the etch front tends to follow the contours of the initial surface and/or selectively etch some parts relative to others. Mechanical polishing, long used in the optical industry, was known to remove material along a planar front but was associated with surface damage that could not be tolerated in semiconductor structures.

To overcome the problems associated with purely mechanical polishing, the process called chemical mechanical polishing (CMP) was developed. As the name implies, surfaces subjected to CMP are exposed to both chemical and mechanical polishing simultaneously. What CMP provided was the ability to remove material along an approximately planar etch front at reasonable rates without leaving behind a damaged surface. This made CMP highly attractive as a means for planarizing a surface and it has been used for this purpose by the semiconductor industry for some years.

The removal rate of material from a surface undergoing CMP, is controlled by a number of factors including the hardness and size of the slurry particles, the reactivity of the slurry liquid, the flow rate at which slurry is introduced, the rotational speed of the platen, and the force (pressure) between the surface being polished and the platen.

Although CMP has enjoyed great success as a planarization technique, it is not without its problems. A particular example of this is when a surface comprising a mix of hard and soft materials needs to be planarized as is the case when damascene wiring is being manufactured.

Referring now to FIG. 1, we show a schematic cross-section of a dielectric layer 11 (the top-most layer of an integrated circuit wafer at some stage in the manufacturing process) in whose upper surface several trenches, such as 13a and 13b, have previously been formed. Copper layer 12 has been deposited over 11 in a sufficient quantity to ensure that all the trenches have been over-filled with the copper. This gives the copper layer 12 an upper surface that consists of peaks, such as 14, and valleys, such as 15. CMP is now to be used to remove all copper that is not in the trenches, i.e. leaving the trenches just-filled while at the same time removing all traces of copper from everywhere else on layer 11's upper surface.

A typical result obtained using CMP technology of the prior art is illustrated in FIG. 2. At the process point where the surface of 11 appears to be free of copper, it is found that considerable dishing 25 of the trenches has occurred so that, instead of being just-filled, the trenches are under-filled. This is a consequence of the fact that, as the surface of 11 was being approached, the polish rate above the hard dielectric became significantly slower relative to the polish rates over areas where copper extended for a significant depth.

In practice it is often necessary to continue CMP beyond the stage illustrated in FIG. 2 because of residual copper traces still present on surfaces away from the trenches, causing the dishing to become even more severe than illustrated in FIG. 2.

The present invention teaches how damascene wiring may be formed in which the trenches are just-filled with copper while at the same time removing all traces of copper everywhere else. A routine search of the prior art was conducted but no references teaching the exact method of the present invention were found. Several references of interest were, however, seen. For example, Joshi et al. (U.S. Pat. No. 5,731,245) teach the use of a tungsten-germanium alloy as a hard cap for surface passivation and also as a polish stop. They emphasize that the slurry must have a hardness at least twice that of the metal being subjected to CMP.

Chow et al. (U.S. Pat. No. 4,789,648) give one of the earliest descriptions of the dual damascene process, including overfilling and then planarizing with CMP.

Krishnan et al. (U.S. Pat. No. 5,451,551) use two different barrier layers which enables them to achieve full planarization as well as full barrier protection of the conductor in a single operation.

Schacham-Diamand et al. (U.S. Pat. No. 5,824,599) show how a damascene trench may be filled with copper using an electroless process, following which conventional CMP is used to achieve planarization.

SUMMARY OF THE INVENTION

It has been an object of the present invention to provide a process for filling a trench in a hard dielectric material with a layer of soft material whereby at the conclusion of the process no dishing of the soft material within the trenches has occurred.

Another object of the invention has been to provide a process for the formation of damascene wiring in an integrated circuit, particularly with copper as the metal.

A further object of the invention has been that said process be fully compatible with existing processes for manufacturing integrated circuits.

These objects have been achieved by first over-filling the trenches with the soft material (such as copper) and then depositing on the copper surface a relatively thin layer of a hard material such as tantalum, tantalum nitride, titanium, titanium nitride etc. Under a first set of control conditions CMP is applied for just long enough to selectively remove this hard material layer from peaks in the copper surface while leaving it intact in the valleys. The control conditions for CMP are then adjusted so that CMP can proceed with material at the peaks being removed at a significantly faster rate than in the valleys. Thus, when the point is reached that all copper outside the trenches has been removed, the trenches are found to be just filled with a flat layer that has no dishing.

BRIEF DESCRIPTION OF THE DRAWINGS

FIG. 1 shows a dielectric layer in whose upper surface trenches have been formed and then over filled with a layer of soft material.

FIG. 2 shows the structure of FIG. 1 after planarization using chemical mechanical polishing, illustrating how dishing can occur over the surface of the trenches.

FIG. 3 illustrates the deposition of a hard layer over the soft layer.

DESCRIPTION OF THE PREFERRED EMBODIMENTS

The process of the present invention begins with the structure already seen in FIG. 12, i.e. trenches such as 13a and 13b, previously formed in dielectric layer 11 (of silicon oxide) and then over-filled with copper layer 12. The trenches typically have widths between about 0.2 and 2,000 microns. Although not shown in the figures (since it is not needed to successfully apply the process of the present invention) it is usual to include a barrier layer of a material such as tantalum or tantalum nitride, between about 100 and 900 Angstroms thick, between the copper layer and the dielectric layer.

Referring now to FIG. 3, in a departure from prior art practice, a layer of a hard material 33, such as tantalum, tantalum nitride, titanium, or titanium nitride, between about 100 and 1,500 Angstroms thick, is deposited over copper layer 12.

CMP is then used under the following set of conditions:

a slurry of particles of materials such as aluminum oxide, silicon oxide, or cerium oxide, in hydrogen peroxide or water, having a flow rate between about 50 and 500 SCCM, on a platen rotating at a speed between about 20 and 200 RPM, with a force between the soft material layer and said platen of between about 3 and 7 PSI.

Figure 4:
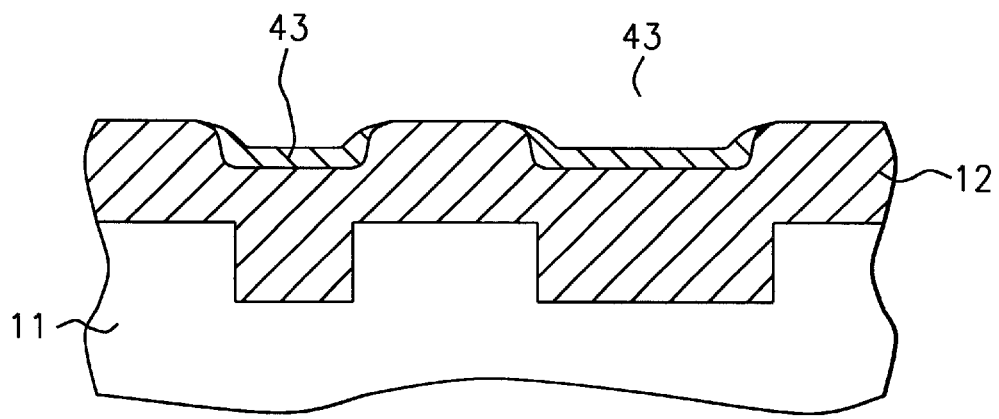
FIG. 4 illustrates the effect of selectively removing the hard layer of FIG. 3 from the peaks while leaving it intact in the valleys.

Under these conditions it is possible to selectively remove hard layer 33 from the peaks (see 14 in FIG. 1) while leaving it intact in the valleys (see 15 in FIG. 1), thereby giving the structure the appearance illustrated in FIG. 4 where hard layer 43 is seen to be selectively covering only those parts of copper layer 12 that fill a trench.

Once the hard layer has been removed from the peaks, CMP is continued under a second set of conditions:

a slurry of alumina or silica particles, in water or hydrogen peroxide, having a flow rate between about 50 and 500 SCCM, on a platen rotating at a speed between about 20 and 200 RPM, with a force between the soft material layer and said platen of between about 3 and 7 PSI.

Figure 5:
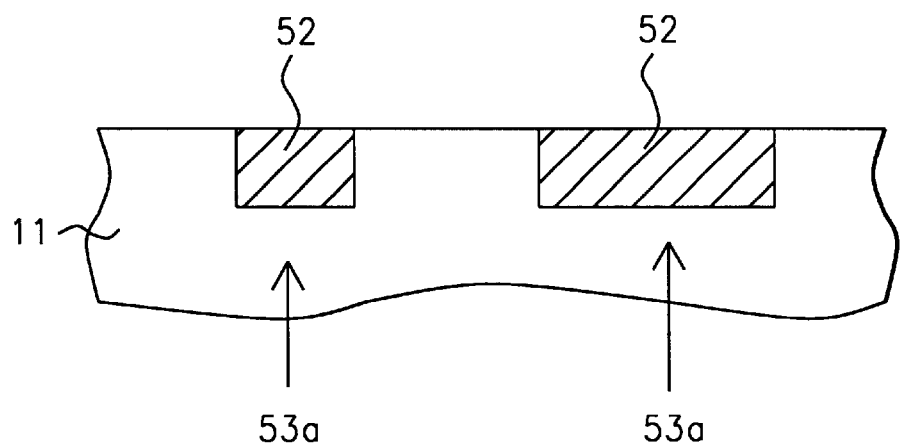
FIG. 5 shows a structure obtained as a result of following the process of the present invention for planarizing the surface of a damascene structure.

Under this second set of conditions, and on this structure, both the peaks and the valleys get polished but material in the peaks gets removed at a faster rate than material in the valleys. Typically, the ratio of peak removal rate to valley removal rate is between about 50 and 5 to 1. For this polishing ratio and for trench depths between about 0.4 and 2 microns and for a copper layer thickness of between about 5,000 and 20,000 Angstroms, layer 43 will be fully removed at just about the time that all of layer 12 outside the trenches is also removed, resulting in the structure shown in FIG. 5 where trenches 53a and 53b can be seen to be just filled with copper material 52, without the introduction of any dishing effects.

We conclude the description of the process of the present invention by noting that, although it has been described in terms of copper filling trenches in the topmost layer of an integrated circuit, it is more general than this and could be applied to structures other than integrated circuits for the filling of trenches or holes in a variety of dielectric materials such as silicon oxide, silicon nitride, silicon oxynitride, and low k dielectrics in general with soft metals such as aluminum, copper, or aluminum-copper alloys.

While the invention has been particularly shown and described with reference to the preferred embodiments thereof, it will be understood by those skilled in the art that various changes in form and details may be made without departing from the spirit and scope of the invention.

What is claimed is:

1. A process for filling trenches with a soft material, comprising:

providing a layer of a dielectric material having a surface in which said trenches have been formed;

depositing a layer of the soft material to a thickness sufficient to overfill the trenches whereby the soft material layer has an upper surface comprising valleys above said trenches and peaks elsewhere;

depositing one, and only one, layer of a hard material over said layer of soft material;

using CMP, under a first set of conditions, selectively removing said hard layer from the peaks while leaving it unchanged in the valleys;

using CMP, under a second set of conditions, polishing both the peaks and the valleys, whereby material in the peaks is removed at a faster rate than material in the valleys; and continuing to polish under said second set of conditions until all soft material outside the trenches has been removed.

2. The process of claim 1 wherein the first set of polishing conditions further comprises using a slurry of particles, selected from the group consisting of aluminum oxide, silicon oxide, and cerium oxide, in water or hydrogen peroxide, having a flow rate between about 50 and 500 SCCM, on a platen rotating at a speed between about 20 and 200 RPM, with a force between the soft material layer and said platen of between about 3 and 7 PSI.

3. The process of claim 1 wherein the second set of polishing conditions further comprises using a slurry of particles, selected from the group consisting of aluminum oxide, and silicon oxide, in water or hydrogen peroxide, having a flow rate between about 50 and 500 SCCM, on a platen rotating at a speed between about 201 and 500 RPM, with a force between the soft material layer and said platen of between about 3 and 7 PSI.

4. The process of claim 1 wherein the soft material is selected from the group consisting of copper, aluminum, and aluminum-copper alloys.

5. The process of claim 1 wherein the layer of soft material has thickness between about 5,000 and 50,000 Angstroms.

6. The process of claim 1 wherein the hard material is selected from the group consisting of tantalum, tantalum nitride, titanium, and titanium nitride.

7. The process of claim 1 wherein the layer of hard material has thickness between about 100 and 900 Angstroms.

8. The process of claim 1 wherein the dielectric material is selected from the group consisting of silicon oxide, silicon nitride, silicon oxynitride, and low dielectric constant materials.

9. The process of claim 1 wherein the trenches have a width that is between about 0.1 and 2,000 microns.

10. The process of claim 1 wherein the trenches have a depth that is between about 0.4 and 20 microns.

11. The process of claim 1 wherein material in the peaks is removed at a rate that is between about 2 and 50 times faster than for material in the valleys.

12. A process to prevent copper dishing during formation of damascene wiring, comprising:
providing a partially formed integrated circuit including an upper layer of a dielectric material;
patterning and then etching said dielectric layer thereby forming trenches in its surface;
depositing a layer of copper to a thickness sufficient to overfill the trenches whereby the copper layer has an upper surface comprising valleys above said trenches and peaks elsewhere;
depositing one, and only one, layer of a hard material over said layer of copper;
using CMP, under a first set of conditions, selectively removing said hard layer from the peaks while leaving it unchanged in the valleys;
using CMP, under a second set of conditions, polishing both the peaks and the valleys, whereby material in the peaks is removed at a faster rate than material in the valleys, and
continuing to polish under said second set of conditions until all copper outside the trenches has been removed, thereby forming damascene wiring that just fills the trenches.

13. The process of claim 12 wherein the first set of polishing conditions further comprises using a slurry of particles, selected from the group consisting of aluminum oxide, silicon oxide, and cerium oxide, in water or hydrogen peroxide, having a flow rate between about 50 and 500 SCCM, on a platen rotating at a speed between about 20 and 200 RPM, with a force between the copper layer and said platen of between about 3 and 7 PSI.

14. The process of claim 12 wherein the second set of polishing conditions further comprises using a slurry of particles, selected from the group consisting of aluminum oxide, and silicon oxide, in water or hydrogen peroxide, having a flow rate between about 50 and 500 SCCM, on a platen rotating at a speed between about 201 and 500 RPM, with a force between the copper layer and said platen of between about 3 and 7 PSI.

15. The process of claim 12 wherein the layer of copper has thickness between about 0.4 and 2 microns.

16. The process of claim 12 wherein the hard material is selected from the group consisting of tantalum, tantalum nitride, titanium, and titanium nitride, and has a thickness between about 100 and 900 Angstroms.

17. The process of claim 12 further comprising depositing a barrier layer between the copper and the dielectric layers.

18. The process of claim 12 wherein the dielectric material is selected from the group consisting of silicon oxide, silicon nitride, silicon oxynitride, and low dielectric constant materials.

19. The process of claim 12 wherein the trenches have a width that is between about 0.1 and 1,000 microns and a depth that is between about 0.4 and 2 microns.

20. The process of claim 12 wherein material in the peaks is removed at a rate that is between about 2 and 50 times faster than for material in the valleys.

* * * * *